United States Patent
Chen et al.

(10) Patent No.: US 11,342,297 B2
(45) Date of Patent: May 24, 2022

(54) PACKAGE STRUCTURE AND MANUFACTURING METHOD THEREOF

(71) Applicant: Taiwan Semiconductor Manufacturing Co., Ltd., Hsinchu (TW)

(72) Inventors: Ming-Fa Chen, Taichung (TW); Hsien-Wei Chen, Hsinchu (TW); Jie Chen, New Taipei (TW); Sen-Bor Jan, Tainan (TW); Sung-Feng Yeh, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/877,512

(22) Filed: May 19, 2020

(65) Prior Publication Data

US 2021/0098409 A1    Apr. 1, 2021

Related U.S. Application Data

(60) Provisional application No. 62/906,751, filed on Sep. 27, 2019.

(51) Int. Cl.
| | |
|---|---|
| H01L 23/544 | (2006.01) |
| H01L 21/78 | (2006.01) |
| H01L 23/00 | (2006.01) |
| H01L 23/31 | (2006.01) |
| H01L 21/56 | (2006.01) |

(52) U.S. Cl.
CPC .............. *H01L 24/29* (2013.01); *H01L 21/56* (2013.01); *H01L 21/78* (2013.01); *H01L 23/3157* (2013.01); *H01L 23/544* (2013.01); *H01L 24/11* (2013.01); *H01L 24/13* (2013.01); *H01L 24/27* (2013.01); *H01L 2223/54426* (2013.01)

(58) Field of Classification Search
CPC ......... H01L 23/544; H01L 2223/54426; H01L 23/3128
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |

(Continued)

*Primary Examiner* — Dale E Page
*Assistant Examiner* — Wilner Jean Baptiste
(74) *Attorney, Agent, or Firm* — JCIPRNET

(57) ABSTRACT

A package structure including at least one die laterally encapsulate by an encapsulant, a bonding film and an interconnect structure is provided. The bonding film is located on a first side of the encapsulant, and the bonding film includes a first alignment mark structure. The package structure further includes a semiconductor material block located on the bonding film. The interconnect structure is located on a second side of the encapsulant opposite to the first side, and the interconnect structure includes a second alignment mark structure. A location of the first alignment mark structure vertically aligns with a location of the second alignment mark structure.

20 Claims, 11 Drawing Sheets

(56) References Cited

U.S. PATENT DOCUMENTS

| | | |
|---|---|---|
| 9,372,206 B2 | 6/2016 | Wu et al. |
| 9,496,189 B2 | 11/2016 | Yu et al. |
| 2019/0096867 A1* | 3/2019 | Chen .................. H01L 25/0652 |

* cited by examiner

PACKAGE STRUCTURE AND MANUFACTURING METHOD THEREOF

CROSS-REFERENCE TO RELATED APPLICATION

This application claims the priority benefit of U.S. provisional application Ser. No. 62/906,751, filed on Sep. 27, 2019. The entirety of the above-mentioned patent application is hereby incorporated by reference herein and made a part of this specification.

BACKGROUND

Wafer-level packaging (WLP) involves packaging the dies on the wafer and then dicing into individual packages. The resulting packages are small in sizes and suitable for packaging footprint-sensitive devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
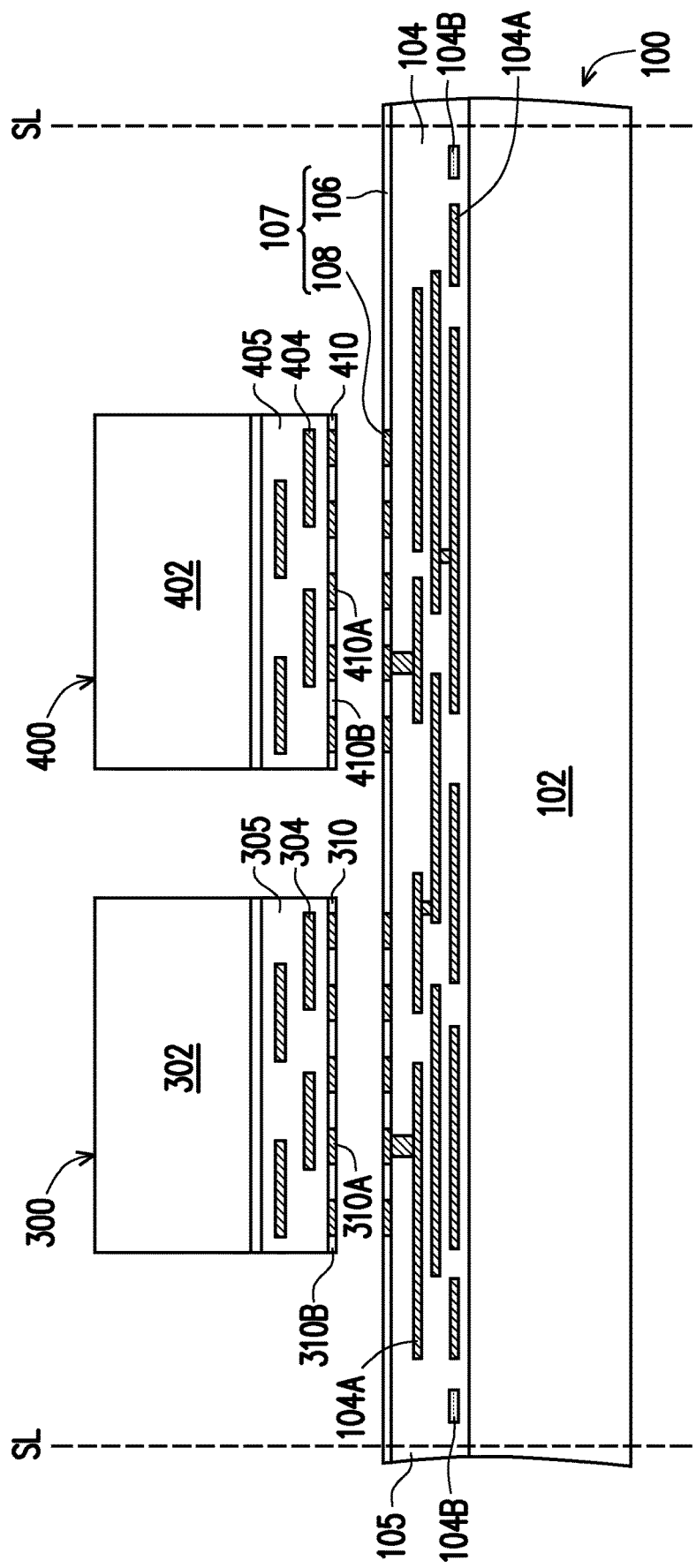
FIGS. 1-5 are schematic cross-sectional views showing various stages of the manufacturing method for forming the package structure according to some embodiments of the present disclosure.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be appreciated that the following embodiment(s) of the present disclosure provides applicable concepts that can be embodied in a wide variety of specific contexts. The specific embodiment(s) discussed herein is merely illustrative and is related to a package structure or assembly, and does not limit the scope of the present disclosure. Embodiments of the present disclosure describe the exemplary manufacturing process of wafer-level packaging and the package structures fabricated there-from. Certain embodiments of the present disclosure are related to the package structures formed with wafer bonding structures and stacked wafers and/or dies. The wafers or dies may include one or more types of integrated circuits or electrical components on a bulk semiconductor substrate or a silicon/germanium-on-insulator substrate. The embodiments are intended to provide further explanations but are not used to limit the scope of the present disclosure.

FIGS. 1-5 illustrate the cross-sectional views showing various stages of the manufacturing methods for forming the package structure according to some embodiments of the present disclosure. In FIG. 1, in some embodiments, a first wafer 100 is provided, and the first wafer 100 includes a first semiconductor substrate 102, a first interconnect structure 104 formed on the first semiconductor substrate 102 and a first bonding film 106 covering the first interconnect structure 104 over the semiconductor substrate 102. In some embodiments, the first wafer 100 further includes first bonding pads 108 embedded in the first bonding film 106. The first bonding film 106 and the first bonding pads 108 may form a first bonding structure 107. In some embodiments, the first wafer 100 is a semiconductor wafer made of silicon (such as a silicon bulk wafer) or other semiconductor materials, such as III-V semiconductor materials. In some embodiments, the first interconnect structure 104 includes one or more metallic interconnect layers 104A embedded in a dielectric material 105. In some embodiments, the first interconnect structure 104 includes one or more first alignment mark structures 104B embedded in the dielectric material 105. In certain embodiments, the locations of the first alignment mark structures 104B are arranged beside the scribe lane (shown as dotted lines SL in FIG. 1) but located within the span of the package unit. That is, the first alignment mark structures 104B will not be cut off during the singulation process or the dicing process. In some embodiments, the one or more metallic interconnect layers 104A may comprise alternating layers of interconnect lines and interconnect vias. The one or more metallic interconnect layers 104A are further electrically coupled with the semiconductor dies subsequently mounted on the first interconnect structure 104 through the interconnect lines and interconnect vias. In some embodiments, the one or more metallic interconnect layers 104A further comprise seal ring structures, which are formed together with the interconnect lines and interconnect vias but are not electrically connected with the semiconductor dies.

In some embodiments, the material of the metallic interconnect layers 104A includes aluminum, copper, copper alloys, or a combination thereof. In some embodiments, the material of the first alignment mark structures 104B includes aluminum, copper, copper alloys, or a combination thereof. In some embodiments, the material of the dielectric material 105 includes silicon oxide, silicon nitride, silicon oxynitride (SiON), silicate glass materials or the combination thereof. In some embodiments, the material of the first bonding film 106 includes silicon oxide, silicon nitride, undoped silicate glass material or a combination thereof. In addition, the material of the first bonding pads 108 includes copper or copper alloys. In certain embodiments, the first interconnect structure 104 may be formed in the semiconductor wafer 100 using the back-end-of-line (BEOL) processes. In some embodiments, the first alignment mark structures 104B are fabricated during the fabrication of the metallic interconnect layers 104A. In one embodiment, the first alignment mark structures 104B are fabricated simultaneously with the bottommost metallic layer of the metallic interconnect layers 104A during the BEOL processes, and the material of the first alignment mark structure(s) 104B is the same as that of the metallic interconnect layer 104A. Further, in some embodiments, the first alignment mark structures may be formed when the metallic interconnect layers 104A are formed, so that no additional process is needed for forming the alignment marks.

In FIG. 1, a third die 300 and a fourth die 400 are provided and mounted onto the first wafer 100. In some embodiments, the third die 300 and the fourth die 400 are provided with hybrid bonding structures 310, 410 respectively. The third die 300 and the fourth die 400 are disposed side-by side on the first bonding film 106 of the first wafer 100. As shown in FIG. 1, in some embodiments, the third die 300 is a semiconductor die including a third semiconductor substrate 302 and third metallization structures 304 embedded in a third dielectric layer 305, and the hybrid bonding structure 310 includes conductive features 310A embedded in a third bonding film 310B formed on the active surface of the third die 300. In some embodiments, the fourth die 400 is a semiconductor die including a fourth semiconductor substrate 402 and fourth metallization structures 404 embedded in a fourth dielectric layer 405, and the hybrid bonding structure 410 includes conductive features 410A embedded in a fourth bonding film 410B formed on the active surface of the fourth die 400.

In some embodiments, the third die 300 or the fourth die 400 may further include semiconductor devices (not shown) and isolation structures (not shown). In certain embodiments, the semiconductor devices may be formed in the semiconductor substrate of the die during the front-end-of-line (FEOL) processes. In certain embodiments, the semiconductor devices are transistors, memories or power devices, or other devices such as capacitors, resistors, diodes, photo-diodes, sensors or fuses. In exemplary embodiments, some of the semiconductor devices may be electrically connected with the metallization structures of the semiconductor die and further electrically connected with some of the conductive features of the third die or the fourth die.

It is understood that the number of the third or fourth die may be one, two or more, but the disclosure is not limited thereto. In some embodiments, the third die 300 and the fourth die 400 have different functions. In some embodiments, the third die 300 and the fourth die 400 have the same function. In some embodiments, the third die 300 or the fourth die 400 includes a memory chip such as a high bandwidth memory chip, a dynamic random access memory (DRAM) chip or a static random access memory (SRAM) chip. In some alternative embodiments, the third die 300 or the fourth die 400 includes an application-specific integrated circuit (ASIC) chip, an analog chip, a sensor chip, a wireless application chip such as a Bluetooth chip and a radio frequency chip or a voltage regulator chip. In one embodiment, the third die 300 includes a memory chip, and the fourth die 400 includes an ASIC chip.

In exemplary embodiments, the conductive features 310A, 410A are made of metal materials, such as copper or cooper alloys. In some embodiments, the material of the third or fourth metallization structures 304, 404 includes copper, copper alloys, aluminum, aluminum alloys, titanium, nickel or combinations thereof. In some embodiments, a material of the third or fourth dielectric layer 305, 405 includes silicon oxide, silicon nitride, or silicon oxynitride (SiON).

Figure 2:
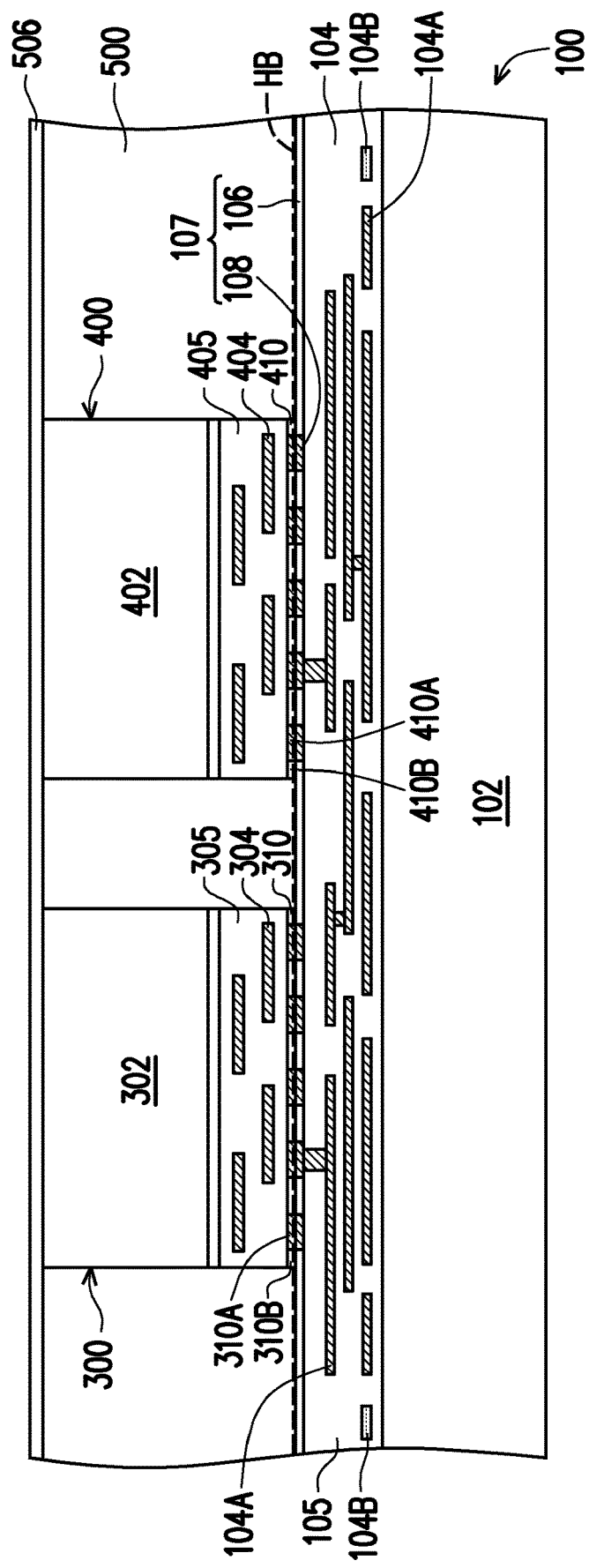

In some embodiments, as shown in FIG. 2, a bonding process is performed to bond the third die 300 and the fourth die 400 with the first wafer 100. In some embodiments, the bonding process is a hybrid bonding process including performing a thermal process at a temperature ranging from 100° C. to 280° C. under a pressure of about 0.5-5 Mpa. In some embodiments, the front side of the third die 300 is hybrid-bonded to the first wafer 100 through the first bonding structure 107 and the hybrid bonding structure 310. That is, the conductive features 310A are bonded with the first bonding pads 108, while the third dielectric layer 310B is bonded with the first bonding film 106 of the first wafer 100. In some embodiments, the front side of the fourth die 400 is hybrid-bonded to the first wafer 100 through the first bonding structure 107 and the hybrid bonding structure 410. That is, the conductive features 410A are bonded with the first bonding pads 108, while the fourth dielectric layer 410B is bonded with the first bonding film 106 of the first wafer 100. In these embodiments, the first bonding structure(s) 107 of the first wafer 100 and the hybrid bonding structures 310, 410 of the third and fourth dies 300, 400 establish shorter and direct electrical paths. In one embodiment, in addition to the metal-to-metal bonding interfaces established by the conductive features 310A, 410A and the first bonding pads 108, the hybrid bonding interface (shown as dashed line HB in FIG. 2) includes the dielectric-to-dielectric interfaces established by the dielectric layers 310B, 410B and the first bonding film 106. Although not expressly shown in FIG. 2, the third die 300 and the fourth die 400 may be electrically connected with each other through some of the conductive features 310A, 410A of the third die or the fourth die, the first bonding structure 107 and the first interconnect structure 104.

Optionally, in some embodiments, the third die 300 or the fourth die 400 may be thinned down from the backside to a desirable thickness. In some embodiments, the thinning down process of the third die 300 or the fourth die 400 may include a polishing process, an etching process or a combination thereof.

In some embodiments, in FIG. 2, an encapsulant 500 is formed over the first wafer 100, the third die 300 and the fourth die 400 and at least laterally covers the third die 300 and the fourth die 400 mounted on the first wafer 100. The encapsulant 500 covers the topside of the first wafer 100, fills the gaps between the third die 300 and the fourth die 400 and wraps around the sidewalls of the third die 300 and the fourth die 400. In some embodiments, the encapsulant 500 is formed by a molding process such as over-molding and then polished or planarized to expose the backsides of the third die 300 and the fourth die 400. In some embodiments, the material of the encapsulant 500 includes epoxy resins, phenolic resins or silicon-containing resins.

In some embodiments, a backside bonding film 506 is formed on the encapsulant 500 covering the backsides of the third die 300 and the fourth die 400. In some embodiments, the material of the backside bonding film 506 includes silicon oxide, silicon nitride, undoped silicate glass material or a combination thereof. In one embodiment, the material of the first bonding film 106 is the same as that of the backside bonding film 506. In one embodiment, the material of the first bonding film 106 is different from that of the backside bonding film 506.

Figure 3:
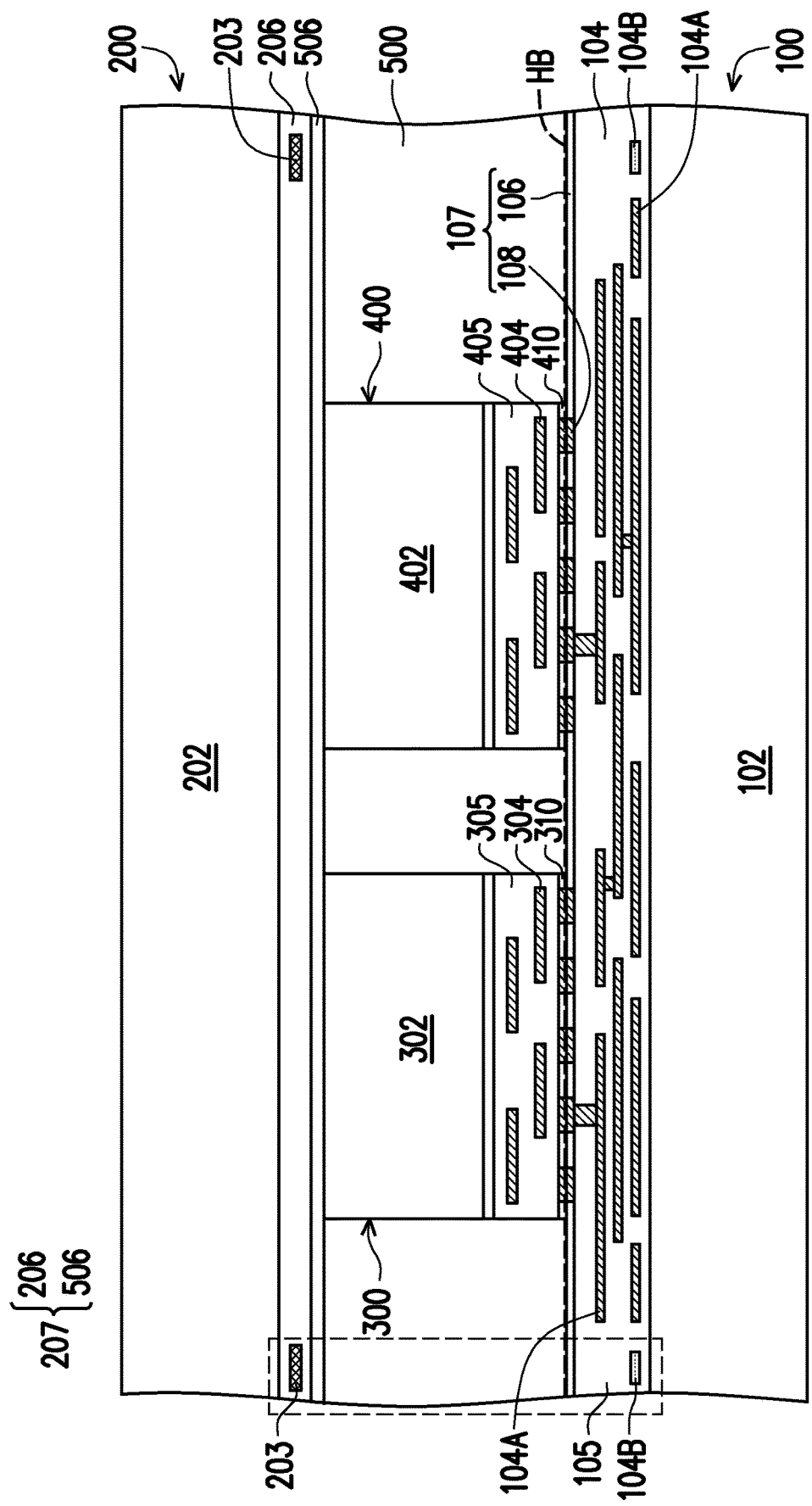

In FIG. 3, in some embodiments, a second wafer 200 is provided, and the second wafer 200 includes a second bonding film 206 formed on and covering a second semiconductor substrate 202 and second alignment mark structures 203 embedded in the second bonding film 206. In FIG. 3, the second wafer 200 is provided with the bonding film 206 facing the backsides of the third die 300 and the fourth die 400 and the first wafer 100 and placed directly on the backside bonding film 506. During the placement of the second wafer 200, the second wafer 200 is vertically aligned with the first wafer 100, and the second alignment mark structures 203 are substantially vertically aligned with the corresponding first alignment mark structures 104B respectively. Then, following the alignment of the second wafer 200 over the first wafer 100, the second wafer 200 is placed on and stacked onto the first wafer 100. In some embodiments, as shown in FIG. 3, a bonding process is performed to bond the second bonding film 206 and the backside bonding film 506 to each other, so as to bond the second wafer 200 to the backsides of the third die 300 and the fourth die 400 and to the encapsulant 500. In some embodiments, the bonding process is a fusion bonding process including performing a thermal process at a temperature ranging from 100° C. to 280° C. under a pressure of about 0.5-5 Mpa. In one embodiment, the second bonding film 206 and the backside bonding film 506 may be regarded as a second bonding structure 207.

In some embodiments, the material of the second bonding film 206 includes silicon oxide, silicon nitride, undoped silicate glass material or a combination thereof. In one embodiment, the material of the second bonding film 206 is the same as that of the backside bonding film 506. In one embodiment, the material of the second bonding film 206 is different from that of the backside bonding film 506. In some embodiments, the second alignment mark structures 203 are not exposed from the second bonding film 206. In some embodiments, the second wafer 200 is a semiconductor wafer similar to the first wafer 100. In some embodiments, the second wafer 200 is a different type of wafer from the first wafer 100. In some embodiments, the second wafer 200 is a bulk silicon wafer. In certain embodiments, the second wafer 200 does not have active devices or semiconductor devices and may function as an interposer or a structural support. In some embodiments, the material of the second alignment mark structures 203 may include a metal material, a metallic material or a resin material. The second alignment mark structures 203 are located in the region(s) outside the die locating region.

In certain embodiments, during the placement of the second wafer 200 over the underlying first wafer 100, as there are alignment mark structures respectively located in the first and second wafers 100, 200 available for alignment, the notch of the second wafer can precisely aligned with the notch of the first wafer, so that less notch shift and better alignment of the wafers can be achieved for the subsequent lithographic processes. For example, the locations of the second alignment mark structures 203 in the second wafer are substantially vertically aligned (along the thickness direction) with those of the corresponding first alignment mark structures 104B. In other words, the locations of the second alignment mark structures 203 are vertically overlapped with the locations of the first alignment mark structures 104B, and the vertical projections of the second alignment mark structures 203 onto the same level (or plane) of the first alignment mark structures 104B at least partially fall within the spans or patterns of the underlying first alignment mark structures 104B. Further details of the patterns of the first or second alignment mark structures and the matching of the corresponding patterns shall be described in the following embodiments.

In the present embodiment, the second wafer 200 and the first wafer 100 are laminated together by referring to the second alignment mark structures 203 in the second wafer and the corresponding first alignment mark structures 104B. Thus, the lamination of the first wafer 100 and the second wafer 200 can be aligned precisely, which is beneficial for the subsequent fabrication processes, especially for the photolithographic processes. With the global alignment marks existing in the wafer(s), wafer to wafer alignment is significantly improved, leading to better pattern transferring and improved pattern fidelity. Accordingly, the yield of the package structures is boosted.

It is noted that the alignment mark structures may be used for in-line alignment, especially for in-line exposure and etching processes, which aims in reducing the risk of misalignment or the needs for rework in order to enhance the throughput and the production yield.

Figure 4:
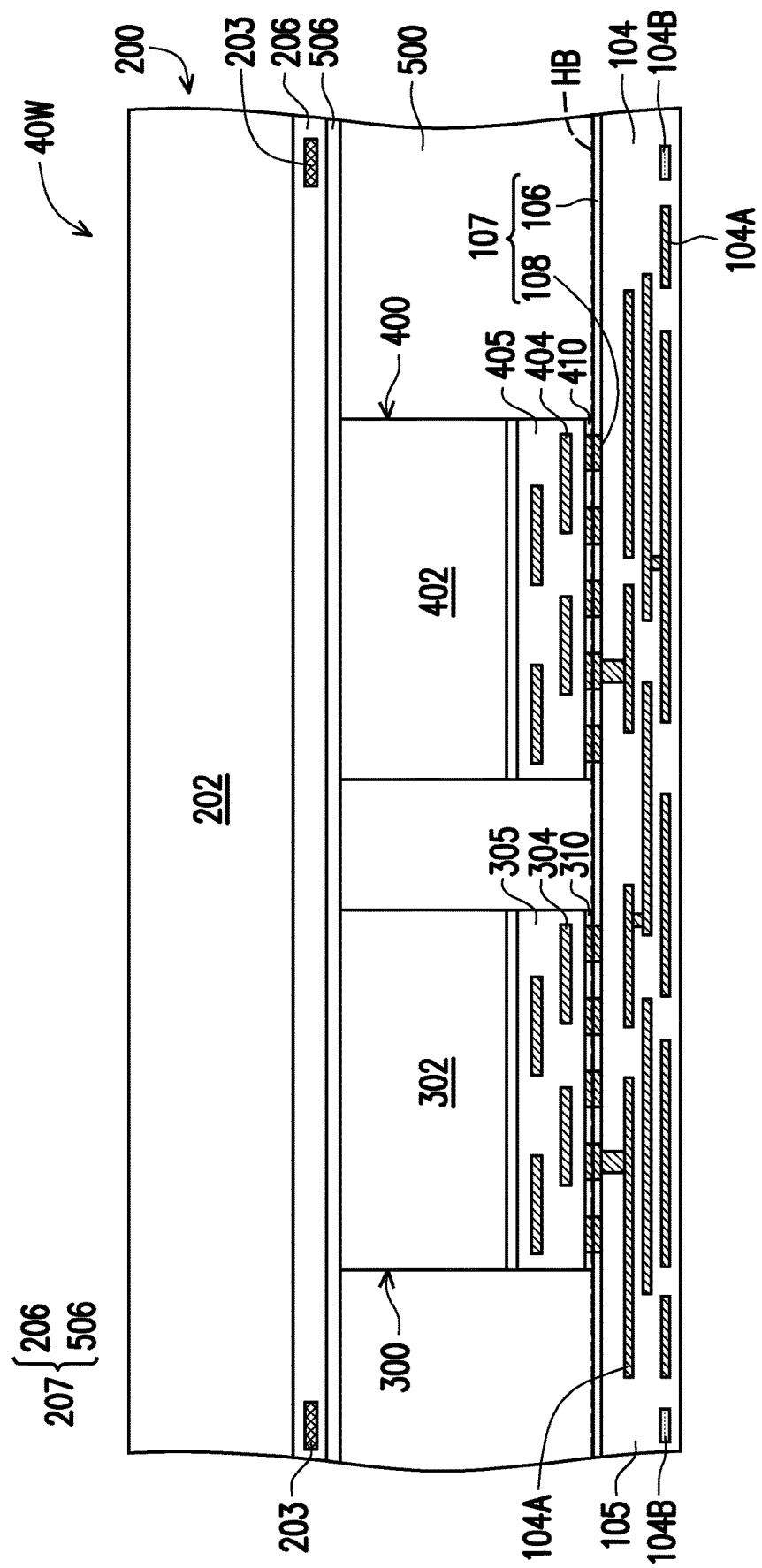

In FIG. 4, in some embodiments, the first semiconductor substrate 102 of the first wafer 100 is removed but the first interconnect structure 104 is remained. In some embodiments, the removal of the first semiconductor substrate 102 of the first wafer 100 may include a polishing process, an etching process or a combination thereof. A stack structure 40W including the first interconnect structure 104, the third die 300, the fourth die 400, the encapsulant 500 and the second wafer 200 is obtained. Herein, the first interconnect structure 104 is exposed after the first semiconductor substrate 102 is removed.

Figure 5:
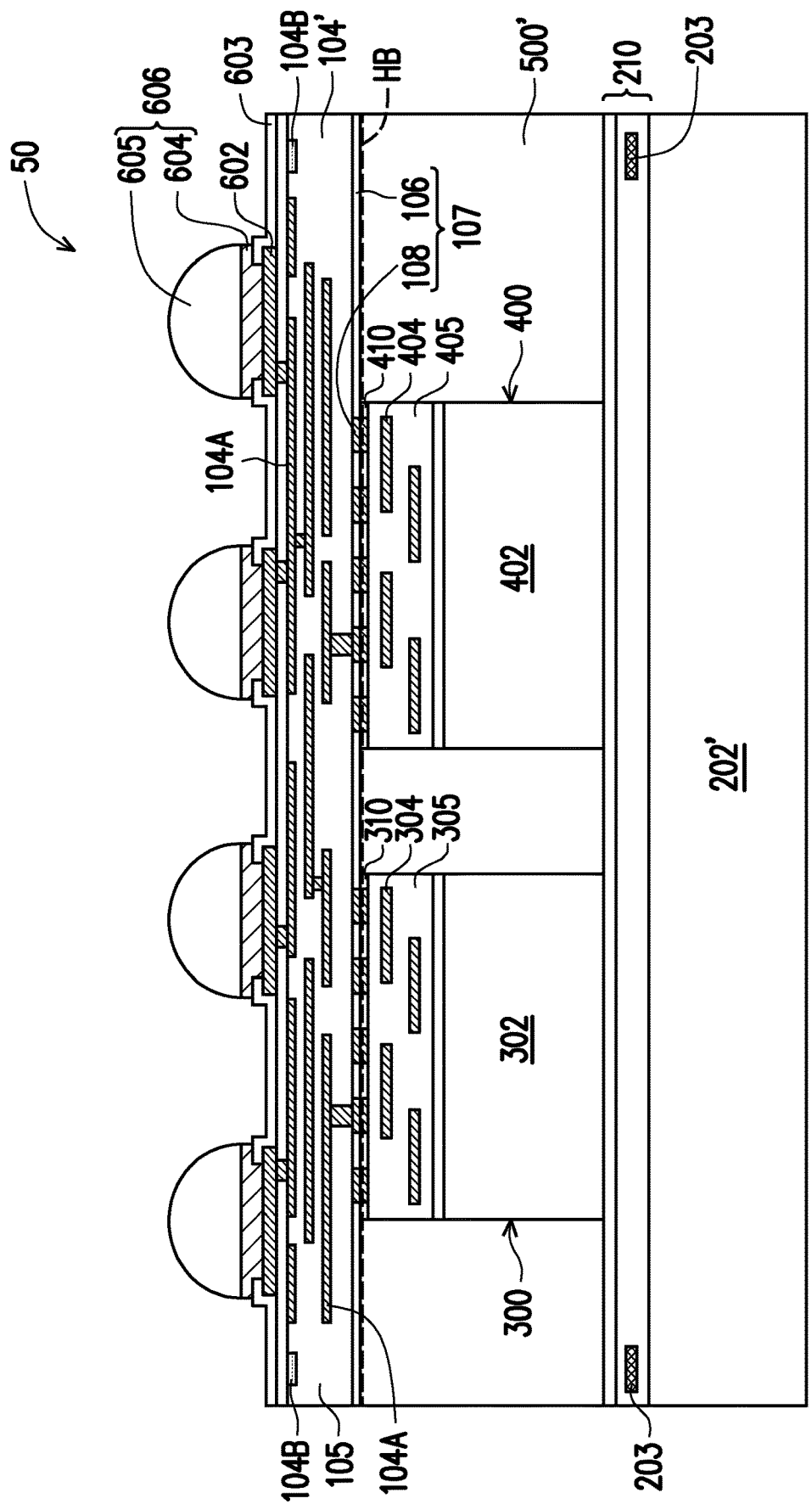

In FIG. 5, in some embodiments, the stack structure 40W (see FIG. 4) is flipped and bump pads 602 and conductive bumps 606 are formed on the interconnect structure 104. In some embodiments, the bump pads 602 are formed on the metallic interconnect layers 104A, and the conductive bumps 606 are formed on the bump pads 602. In certain embodiments, an insulating layer 603 is formed over the interconnect structure 104 and on the bump pads 602. For example, the insulating layer 603 is formed with openings exposing the bump pads 602. Then, metal posts 604 and glops 605 are formed on the exposed bump pads 602 to form the conductive bumps 606. In some embodiments, the material of the insulating layer 603 includes silicon oxide, silicon nitride, benzocyclobutene (BCB), epoxy, polyimide (PI), or polybenzoxazole (PBO). In some embodiments, a material of the metal posts 604 includes copper or cooper alloys, and a material of the glops 605 includes solder materials. In one embodiment, the metal posts 604 and glops 605 located on the metal posts 604 constitute micro bump structures. In alternative embodiments, the conductive bumps 606 include C4 bumps or ball grid array (BGA) bumps.

In some embodiments, in FIG. 5, a singulation process is performed to cut the stack structure 40W into individual package structures 50. In some embodiments, the singulation process includes a wafer dicing process or a sawing process. In some embodiments, the singulation process is performed and the stack structure 40W is diced along the scribe lanes SL, cutting through the insulating layer 603, the interconnect structure 104, the encapsulant 500, the bonding films 506, 206 and the semiconductor substrate 202. Each of the package structures 50 includes at least the semiconductor material block 202' (the cut semiconductor substrate), the third die 300, the fourth die 400, and the encapsulant 500' (the cut encapsulant) wrapping around the third and fourth dies. In some embodiments, each of the package structures 50 also includes the bonding film stack 210 (the cut stack structure of the bonding films 206, 506) located between the block 202' and the encapsulant 500', the interconnect structure 104' (the cut interconnect structure), the bump pads 602 and the conductive bumps 606 located on the bump pads 602. In some embodiments, the semiconductor material block 202' includes no semiconductor devices and functions as a structural support. The third die 300 and the fourth die 400 are electrically connected with the interconnect structure 104' and electrically connected with the conductive bumps 606 located on the interconnect structure 104', but the semiconductor material block 202' is not electrically connected with the third or fourth die. Also, the second alignment mark structures 203 embedded in the bonding film stack 210 may be electrically floated. In details, the first and second alignment mark structures 104B, 203 are included within each of the package structures 50.

In some embodiments, the stack structure 40W is diced along the scribe lanes SL, without cutting through the first and second alignment mark structures 104B, 203. In some embodiments, the first and second alignment mark structures 104B, 203 are located at corner regions of the package structures 50.

Although the steps of the method are illustrated and described as a series of acts or events, it will be appreciated that the illustrated ordering of such acts or events are not to be interpreted in a limiting sense. In addition, not all illustrated process or steps are required to implement one or more embodiments of the present disclosure.

Figure 6A:
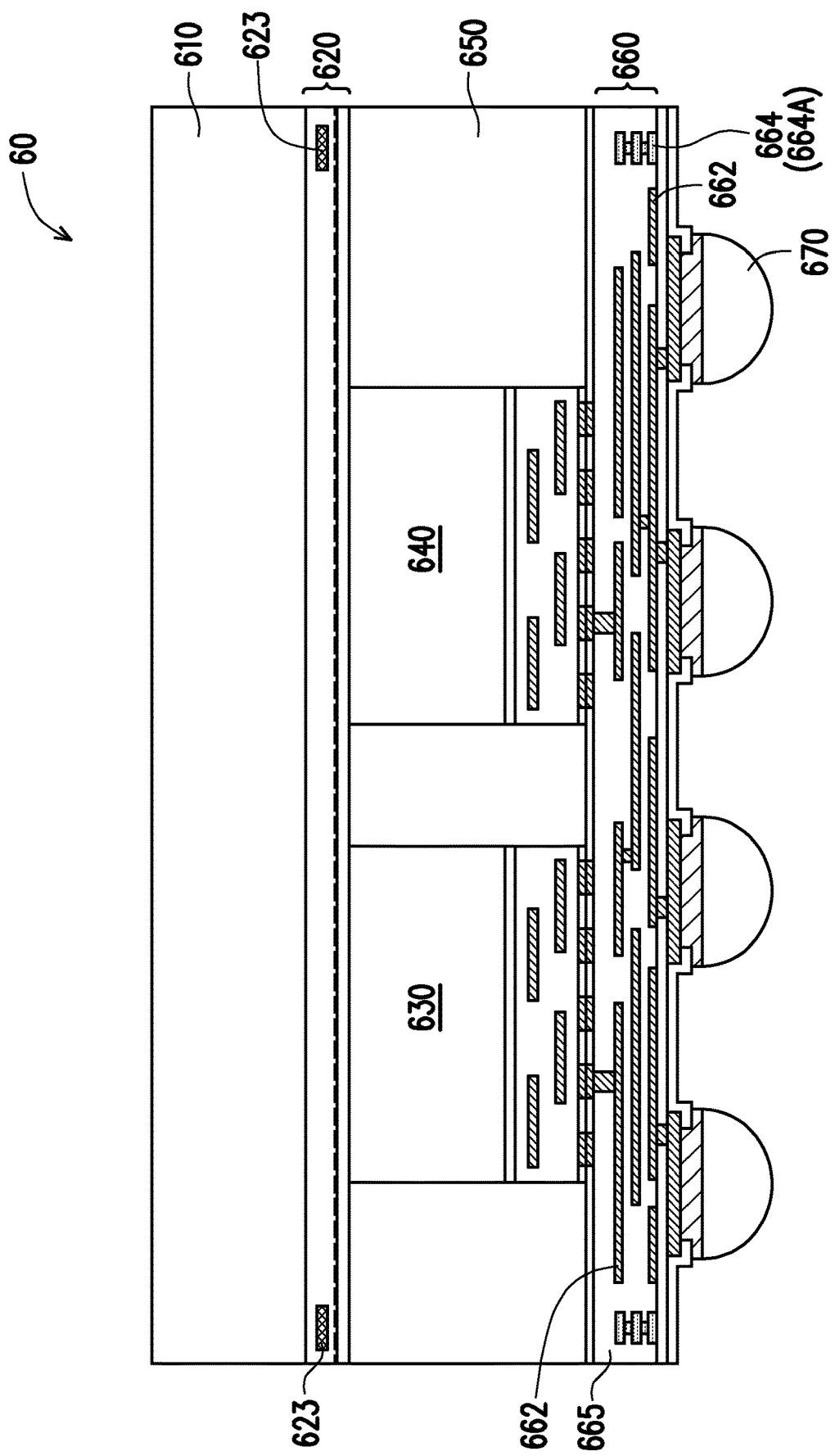
FIG. 6A illustrates a schematic cross-sectional view of an exemplary package structure in accordance with some embodiments of the present disclosure.
Figure 6C:
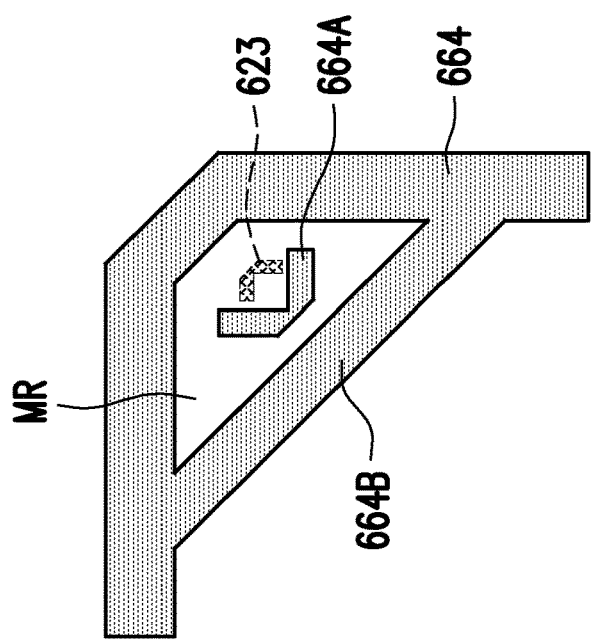
FIG. 6C illustrates an enlarge view of the upper right portion of FIG. 6B.
Figure 6B:
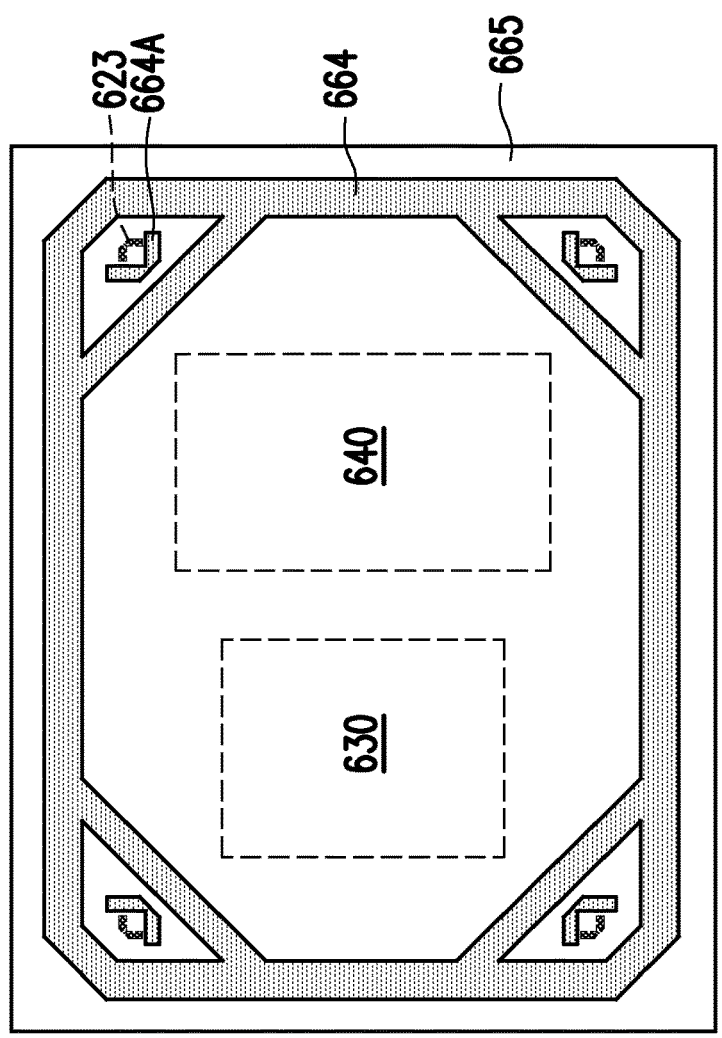
FIG. 6B illustrates a schematic top view showing the layout of the patterns of the seal ring structure and the alignment mark structures relative to the locations of the dies in an exemplary package structure in accordance with some embodiments of the present disclosure.

FIG. 6A illustrates a schematic cross-sectional view of an exemplary package structure in accordance with some embodiments of the present disclosure. FIG. 6B illustrates a schematic top view showing the layout of the patterns of the seal ring structure and the alignment mark structures relative to the locations of the dies in an exemplary package structure in accordance with some embodiments of the present disclosure. FIG. 6C illustrates an enlarge view of the upper right portion of FIG. 6B.

Referring to FIG. 6A, the package structure 60 includes dies 630, 640, an encapsulant 650 wrapping around the dies 630, 640 and a semiconductor material block 610, and a bonding film stack 620 located on a topside of the encapsulant 650. In certain embodiments, the package structure 60 may be formed using the manufacturing methods described in the above embodiments, and similar or the same materials may be used for forming similar or the same elements in the package structure. In some embodiments, the package structure 60 also includes an interconnect structure 660 located at the bottom side of the encapsulant 650 and conductive bumps 670. In some embodiments, the dies 630 and 640 are electrically connected with the interconnect structure 660 and electrically connected with the conductive bumps 670 located on the interconnect structure 660. The semiconductor material block 610 located on the backside of the dies 630, 640 is not electrically connected with the dies 630, 640. In some embodiments, the bonding film stack 620 includes one or more alignment mark structures 623 embedded in the bonding film stack 620. In some embodiments, the interconnect structure 660 includes one or more metallic interconnect layers 662 and at least one seal ring structure 664 embedded in a dielectric material 665. In some embodiments, the interconnect structure 660 includes one or more alignment mark structures 664A embedded in the dielectric material 665. In one embodiment, the alignment mark structure 664A may be fabricated simultaneously with the bottommost metallic layer (i.e. though the same manufacturing step of the bottommost metallic layer) of the metallic interconnect layers 662. In one embodiment, the seal ring structure 664 is fabricated along with some or all of the metallic interconnect layers 662. In some embodiments, the location of at least one of the above alignment mark structures 623 vertically corresponds to (e.g., aligns) the location of at least one of the lower alignment mark structures 664A.

Referring to FIG. 6B and FIG. 6C, in certain embodiments, the seal ring structure 664 has a ring-shaped main structure and located in a peripheral region of the package structure 60, and the projections (represented by the dotted lines in FIG. 6B) of the spans of the dies 630, 640 are enclosed by the ring-shaped structure. In FIG. 6B, the top view of a portion of the seal ring structure 664 is shown. The portion of the seal ring structure 664 is located at the same level with the alignment mark structure(s) 664A. In some embodiments, the seal ring structure 664 also has one or more branch portions 664B connected with its ring-shaped main structure to define and enclose mark regions MR (e.g., the trapezoid regions shown in FIG. 6C). The mark regions MR are located at the corner regions of the package structure 60 and the alignment mark structure(s) 664A is located within the region(s) MR. As the alignment mark structures 664A are located in the seal ring region, there is no design area penalty for generating additional global alignment mark structures. In some embodiments, the alignment mark structure 664A may be located within one or more mark regions MR, while the vertical projection (represented by the dotted lines in FIG. 6C) of the corresponding alignment mark structure 623 falls within the mark region(s) MR. In some embodiments, the projection of the corresponding alignment mark structure 623 is not overlapped with the span of the alignment mark structure 664A but is located beside the alignment mark structure 664A. That is, the projection of the corresponding alignment mark structure 623 is close to but spaced apart from the alignment mark structure 664A as shown in FIG. 6C. In some embodiments, the patterns of the alignment mark structures 664A and 623 are similar in shapes but different in sizes. In one embodiment, as shown in the top view of FIG. 6C, the pattern of the alignment mark structure 664A is shaped like an "L" with a cut corner (i.e. composed of two tetragons respectively connected to two sides of one triangle), while the alignment mark structure 623 has a similar shape but is reverse and smaller in size, so that the projections of both alignment mark structures 623, 664A can be used for accurate alignment and as references for alignment calibration. In details, the alignment mark structures 623 and 664A are located at different levels within the package structure 60.

Figure 7A:
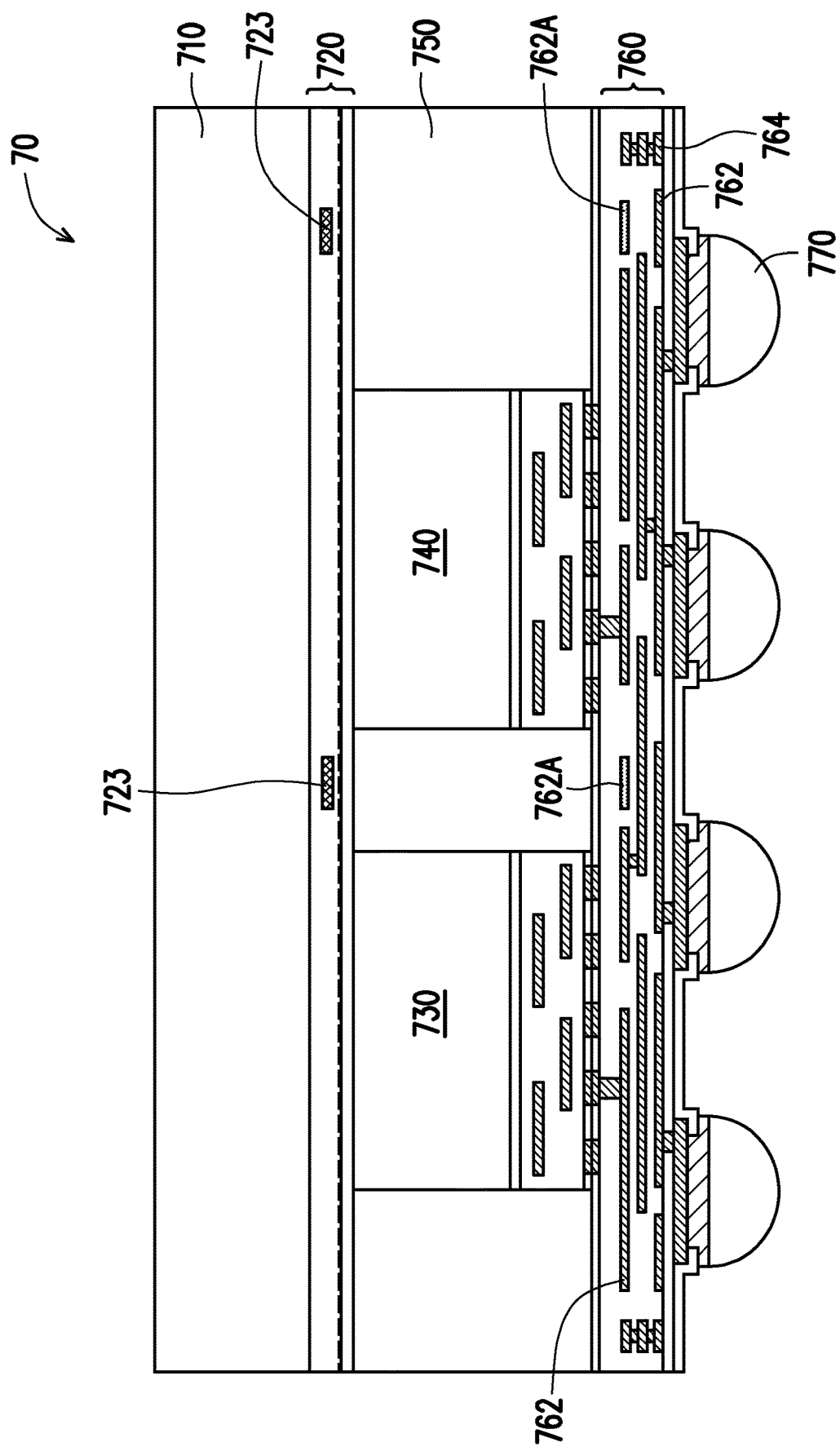
FIG. 7A illustrates a schematic cross-sectional view of an exemplary package structure in accordance with some embodiments of the present disclosure.
Figure 7B:
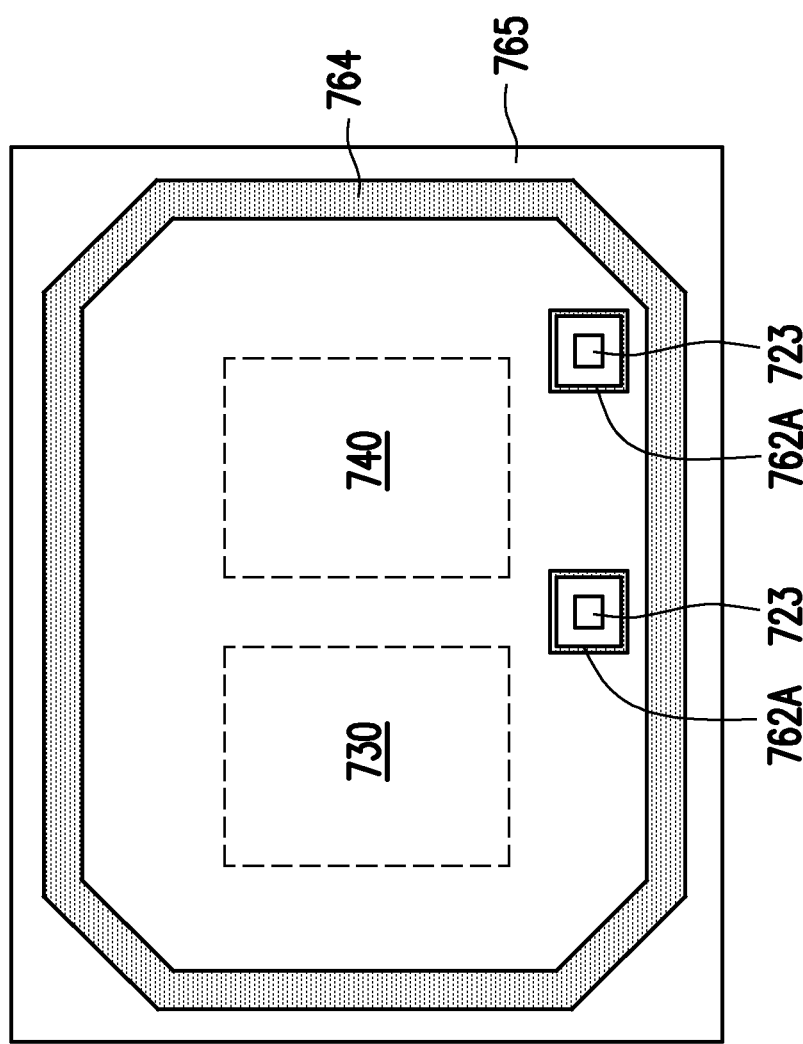
FIG. 7B illustrates a schematic top view showing the layout of the patterns of the seal ring structure and the alignment mark structures relative to the locations of the dies in an exemplary package structure in accordance with some embodiments of the present disclosure.

FIG. 7A illustrates a schematic cross-sectional view of an exemplary package structure in accordance with some embodiments of the present disclosure. FIG. 7B illustrates a schematic top view showing the layout of the patterns of the seal ring structure and the alignment mark structures relative to the locations of the dies in an exemplary package structure in accordance with some embodiments of the present disclosure.

Referring to FIG. 7A and FIG. 7B, the package structure 70 includes the dies 730, 740, the encapsulant 750 laterally wrapping the dies 730, 740, the semiconductor material block 710 and the bonding film stack 720 located on the topside of the encapsulant 750 as well as the interconnect structure 760 and the conductive bumps 770 located on the bottom side of the encapsulant 750. In some embodiments, the bonding film stack 720 includes one or more alignment mark structures 723 embedded in the bonding film stack 720. In some embodiments, the interconnect structure 760 includes one or more metallic interconnect layers 762 and at least one seal ring structure 764 embedded in a dielectric material 765. In some embodiments, the interconnect structure 760 includes one or more alignment mark structures 762A embedded in the dielectric material 765. In one embodiment, the alignment mark structure 762A may be fabricated simultaneously with the topmost metallic layer of the metallic interconnect layers 762. In one embodiment, the seal ring structure 764 is fabricated along with some or all of the metallic interconnect layers 762.

Referring to FIG. 7B, in certain embodiments, the seal ring structure 764 has a ring-shaped main structure and located in a peripheral region of the package structure 70, and the projections (represented by the dotted lines in FIG. 7B) of the spans of the dies 730, 740 are enclosed by the ring-shaped structure. In FIG. 7B, only the top view of a portion of the seal ring structure 764 is shown, and the portion of the seal ring structure 764 is located at the same level with the alignment mark structure(s) 762A. In FIG. 7B, at least one of the alignment mark structures 762A is located beside the seal ring structure 764 (i.e. not located within the seal ring region). In one embodiment, at least one of the alignment mark structures 762A is located between the dies 730, 740. For example, the alignment mark structure 762A located beside the seal ring structure 764 may be used for peripheral alignment of the wafers, while the alignment mark structures 762A located between the dies may be used for central alignment of the wafers, so that better global alignment can be achieved for the wafer-to-wafer lamination or bonding, even under possible warpage situations.

In some embodiments, the locations of the above alignment mark structure 723 correspond to and vertically align with the locations of the lower alignment mark structure 762A. In some embodiments, the pattern of the alignment mark structure 762A may be a square ring structure (in top view), while the pattern of the alignment mark structure 723 is a square block. In some embodiments, the patterns of the alignment mark structures 762A and 723 are complementary to each other. The projection of the above alignment mark structure 723 falls within the pattern of the alignment mark structure 762A. That is, the projection of the square block of the structure 723 falls within the square ring structure of the structure 762A, and preferably the sides of the square block are substantially in parallel with the sides of the square ring structure for precise alignment. The deviation from the parallel sides can be used for further analysis and evaluation to determine whether the alignment is within a satisfactory range.

Figure 8:
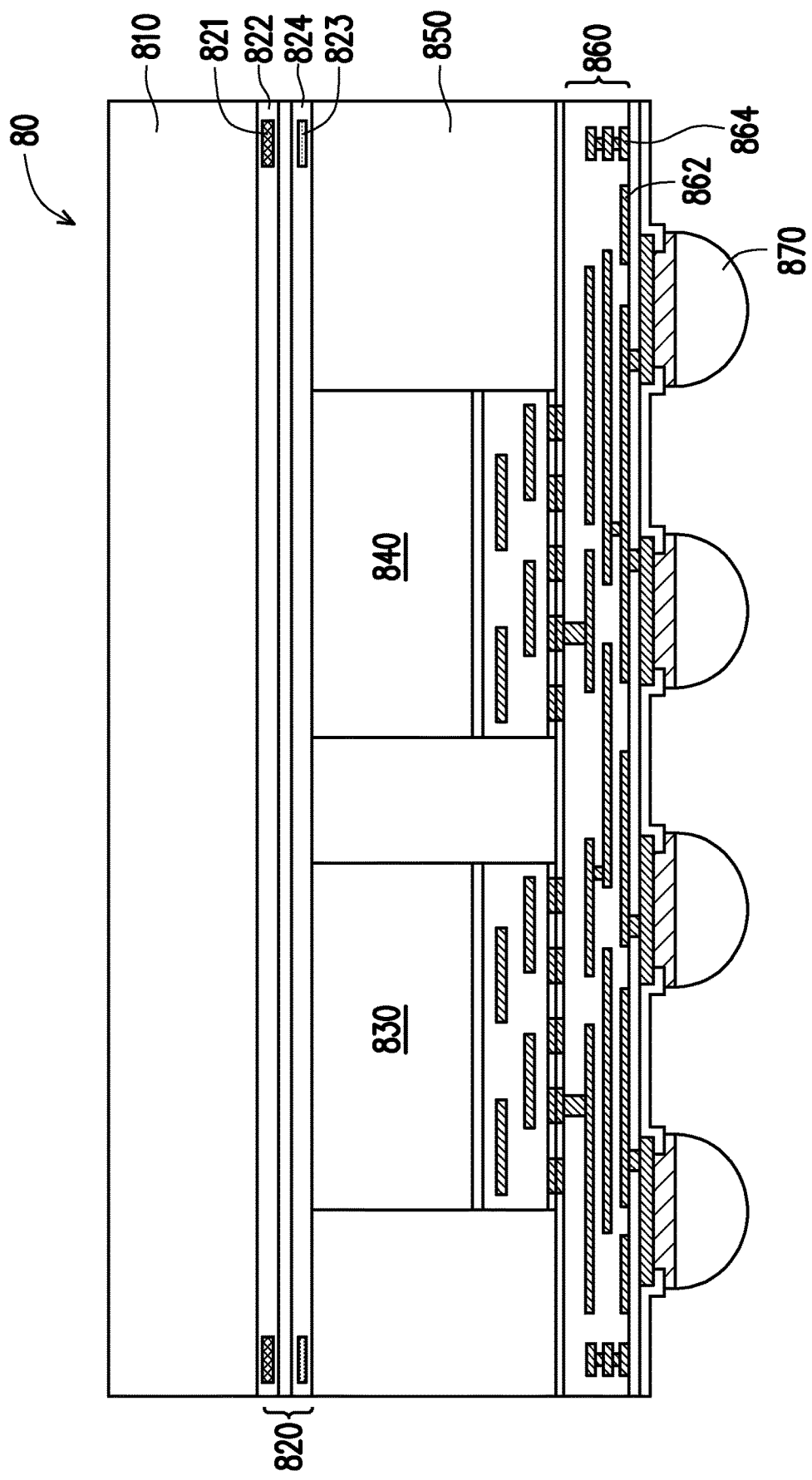
FIG. 8 illustrates a schematic cross-sectional view of an exemplary package structure in accordance with some embodiments of the present disclosure.

FIG. 8 illustrates a schematic cross-sectional view of an exemplary package structure in accordance with some embodiments of the present disclosure. The package structure 80 is similar to the package structure 60, except for having auxiliary alignment mark structures in the bonding film stack. In FIG. 8, in some embodiments, the package structure 80 includes the dies 830, 840, the encapsulant 850 laterally wrapping the dies 830, 840. In FIG. 8, the semiconductor material block 810 and the bonding film stack 820 are located on the topside of the encapsulant 850, while the interconnect structure 860 and the conductive bumps 870 are located on the other side of the encapsulant 850. In some embodiments, the bonding film stack 820 includes one or more first alignment mark structures 821 embedded in the top bonding film layer 822 of the bonding film stack 820 and one or more second alignment mark structures 823 embedded in the bottom bonding film layer 824 of the bonding film stack 820. The location of the first alignment mark 821 vertically aligns with the location of the second alignment mark structure 823. In one embodiment, a material of the first alignment mark 821 is the same as that of the second alignment mark structure 823. In one embodiment, a material of the first alignment mark 821 is different from that of the second alignment mark structure 823. In some embodiments, the interconnect structure 860 includes one or more metallic interconnect layers 862 and at least one seal ring structure 864 embedded in a dielectric material 865. The first and second alignment mark structures 821, 823 are located above the seal ring structure 864 and located in the seal ring region. During wafer to wafer stacking or bonding, the first alignment mark structure(s) 821 in the top bonding film layer 822 and the second alignment mark structure(s) 823 in the bottom bonding film layer 824 respectively belong to the first and second wafers to assist the wafer-to-wafer alignment.

Figure 9:
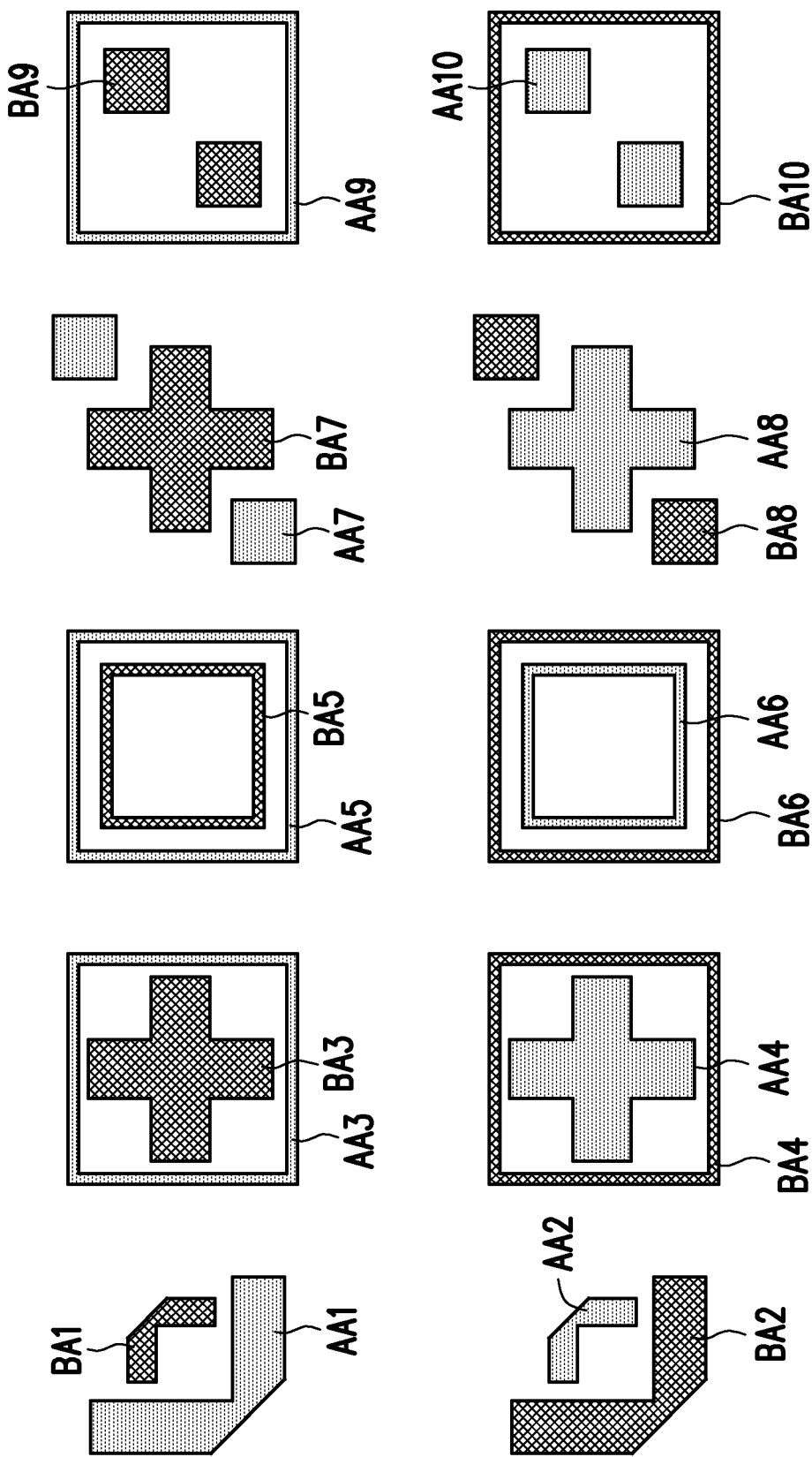
FIG. 9 illustrates different pattern designs for the alignment mark structures in accordance with various embodiments of the present disclosure.

FIG. 9 illustrates different pattern designs for the alignment mark structures in accordance with various embodiments of the present disclosure. As described in the above embodiments, the patterns of the alignment mark structures located at different wafers need to match up or complement to each other. In FIG. 9, the patterns AA1-AA10 refer to possible patterns of the alignment mark structure(s) formed in one of the wafers subject to wafer-to-wafer stacking or bonding, while the patterns BA1-BA10 refer to possible patterns of the another alignment mark structure(s) formed in another one of the wafers subject to wafer-to-wafer stacking or bonding. For the alignment mark structures located at different wafers, the matching of the patterns of the alignment mark structures means that the projections of certain patterns at one level (in one wafer) falls within or by the side of the patterns of other alignment mark structures located at another level (in another wafer). For example, the matching of the patterns AA3 & BA3 means that the cross pattern BA3 falls within the square loop pattern AA3, and preferably the sides of the cross pattern BA3 fall totally within the square loop pattern and spaced apart with a desirable distance or the sides are substantially in parallel with the sides of the square loop structure for precise alignment. The deviation from the desirable distance can be used for further analysis and evaluation to determine whether the alignment is within a satisfactory range.

The package structures 50, 60, 70, 80 including one or multiple dies are packaged in a compact form and can be further assembled with another package unit to form a package-on-package (POP) structure or mounted to a circuit substrate or a printed circuit board.

Other features and processes may also be included. For example, testing structures may be included to aid in the verification testing of the 3D packaging or 3 DIC devices. The testing structures may include, for example, test pads formed in a redistribution layer or on a substrate that allows the testing of the 3D packaging or 3 DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In some embodiments of the present disclosure, a package structure is provided. The package structure includes at least one die laterally encapsulated by an encapsulant, a bonding film and an interconnect structure. The bonding film is located on a first side of the encapsulant, and the bonding film includes a first alignment mark structure. The package structure further includes a semiconductor material block located on the bonding film. The interconnect structure is located on a second side of the encapsulant opposite to the first side, and the interconnect structure includes a second alignment mark structure. A location of the first alignment mark structure vertically aligns with a location of the second alignment mark structure.

In some embodiments of the present disclosure, a package structure including at least one die laterally encapsulated by an encapsulant, a bonding film stack, a semiconductor material block and an interconnect structure is provided. The bonding film stack is located on a first side of the encapsulant, and the bonding film stack includes a first bonding film layer having a first alignment mark structure therein and a second bonding film layer having a second alignment mark structure therein. A location of the first alignment mark structure vertically aligns with a location of the second alignment mark structure. The semiconductor material block is located on the bonding film stack. The interconnect structure is located on a second side of the encapsulant opposite to the first side.

In some embodiments of the present disclosure, a method for forming a package structure is described. A first wafer with an interconnect structure and a first alignment mark structure is provided. Semiconductor dies are bonded with the interconnect structure of the first wafer. An encapsulant is formed over the first wafer at least laterally encapsulating the semiconductor dies. A first bonding film layer is formed over the encapsulant and the semiconductor dies. A second wafer with a second bonding film layer and a second alignment mark structure is provided. The second wafer is aligned and stacked over the first wafer. The first wafer is thinned to expose the interconnect structure. Conductive bumps are formed on the interconnect structure. A dicing process is performed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
at least one die laterally encapsulated by an encapsulant;
a bonding film located on a first side of the encapsulant, wherein the bonding film includes a first alignment mark structure;
a semiconductor material block located on the bonding film; and
an interconnect structure located on a second side of the encapsulant opposite to the first side, wherein the interconnect structure includes a second alignment mark structure and a seal ring structure, a material of the seal ring structure is the same as that of the second alignment mark structure, and wherein the first alignment mark structure vertically aligns with the second alignment mark structure.

2. The structure of claim 1, wherein the interconnect structure includes the seal ring structure and the second alignment mark structure is located within a region where the seal ring structure is located.

3. The structure of claim 2, wherein the seal ring structure includes a ring-shaped main structure surrounding the at least one die and branch portions connected with the ring-shaped main structure to define mark regions, and the second alignment mark structure is located within one of the mark regions.

4. The structure of claim 3, wherein the mark regions are located at corner regions of the package structure.

5. The structure of claim 1, wherein the interconnect structure includes the seal ring structure surrounding the at least one die and the second alignment mark structure is located beside the at least one die and located outside a region where the seal ring structure is located.

6. The structure of claim 1, wherein the at least one die includes a first die and a second die and the second alignment mark structure is located between the first and second dies.

7. The structure of claim 1, wherein the bonding film includes a first bonding film attached to the semiconductor material block and a second bonding film attached to a backside of the at least one die and the encapsulant, and the first bonding film is fusion bonded to the second bonding film.

8. The structure of claim 7, wherein the first alignment mark structure is located within the first bonding film.

9. The structure of claim 1, further comprising conductive bumps located on the interconnect structure.

10. The structure of claim 1, wherein a projection of the first alignment mark structure falls within a pattern of the second alignment mark structure.

11. A package structure, comprising:
at least one die laterally encapsulated by an encapsulant;
a bonding film stack located on a first side of the encapsulant, wherein the bonding film stack includes a first bonding film layer including a first alignment mark structure and a second bonding film layer including a second alignment mark structure, and the first alignment mark structure vertically aligns with the second alignment mark structure;
a semiconductor material block located on the bonding film stack; and
an interconnect structure located on a second side of the encapsulant opposite to the first side.

12. The structure of claim 11, wherein the first bonding film is attached to the semiconductor material block and the second bonding film is attached to a backside of the at least one die and the encapsulant.

13. The structure of claim 11, wherein a material of the first alignment mark is the same as that of the second alignment mark structure.

14. The structure of claim 11, wherein a material of the first alignment mark is different from that of the second alignment mark structure.

15. A method for forming a package structure, comprising:
providing a first wafer including an interconnect structure and a first alignment mark structure;
bonding semiconductor dies with the interconnect structure of the first wafer;
forming an encapsulant over the first wafer at least laterally encapsulating the semiconductor dies;
forming a first bonding film layer over the encapsulant and the semiconductor dies;
providing a second wafer with a second bonding film layer and a second alignment mark structure;
aligning the second alignment mark structure of the second wafer vertically with the first alignment mark structure of the first wafer;
stacking the second wafer over the first wafer;
thinning the first wafer to expose the interconnect structure;
forming conductive bumps on the interconnect structure; and
performing a dicing process.

16. The method of claim 15, wherein aligning the second wafer over the first wafer comprises aligning a location of the second alignment mark structure vertically with a location of the first alignment mark structure.

17. The method of claim 16, further comprising fusion bonding the second bonding film layer with the first bonding film layer after stacking the second wafer over the first wafer.

18. The method of claim 15, wherein forming a first bonding film layer includes forming a third alignment mark structure.

19. The method of claim 15, wherein the first alignment mark structure is located within the interconnect structure.

20. The method of claim 15, wherein performing a dicing process includes cutting through the interconnect structure, the encapsulant and the second wafer without cutting through the first and second alignment mark structures.

* * * * *